(12) United States Patent
Bontas et al.

(10) Patent No.: US 9,343,147 B2
(45) Date of Patent: May 17, 2016

(54) RESISTIVE RANDOM ACCESS MEMORY (RERAM) AND CONDUCTIVE BRIDGING RANDOM ACCESS MEMORY (CBRAM) CROSS COUPLED FUSE AND READ METHOD AND SYSTEM

(71) Applicant: Microchip Technology Incorporated, Chandler, AZ (US)

(72) Inventors: Traian Bontas, Bacau (RO); Claudiu-Dumitru Nechifor, Iasi (RO); Iulian Dumitru, Bucharest (RO); Kent Hewitt, Chandler, AZ (US)

(73) Assignee: MICROSHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 14/199,708

(22) Filed: Mar. 6, 2014

(65) Prior Publication Data

US 2014/0254244 A1    Sep. 11, 2014

Related U.S. Application Data

(60) Provisional application No. 61/775,337, filed on Mar. 8, 2013.

(51) Int. Cl.
*G11C 7/02* (2006.01)
*G11C 11/00* (2006.01)
(Continued)

(52) U.S. Cl.
CPC .............. *G11C 13/004* (2013.01); *G11C 7/065* (2013.01); *G11C 13/0007* (2013.01); *G11C 13/0011* (2013.01); *G11C 14/009* (2013.01); *G11C 17/165* (2013.01); *G11C 17/18* (2013.01)

(58) Field of Classification Search
CPC ....................................................... G11C 7/065

USPC .......................................................... 365/207
See application file for complete search history.

(56) References Cited

U.S. PATENT DOCUMENTS

| 5,959,445 A | 9/1999 | Denham ..................... 323/315 |
| 6,724,654 B1 * | 4/2004 | Swanson et al. ............ 365/158 |

(Continued)

FOREIGN PATENT DOCUMENTS

| WO | 02/01720 A2 | 1/2002 | ............. G11C 16/04 |
| WO | 03/044802 A2 | 5/2003 | ............. G11C 11/16 |

OTHER PUBLICATIONS

Bruchon, N. et al., "Technological Hybridization for Efficient Runtime Reconfigurable FPGAs," IEEE Computer Society Annual Symposium on VLSI, 6 pages, Mar. 11, 2007.

(Continued)

*Primary Examiner* — Son Mai
(74) *Attorney, Agent, or Firm* — Slayden Grubert Beard PLLC

(57) ABSTRACT

By arranging both a conductive and non-conductive resistive memory cell in a cross coupled arrangement to facilitate reading a data state the memory cells can have very small differences in their resistance values and still read correctly. This allows both of the memory cells' resistances to change over time and still have enough difference between their resistances to read the desired data state that was programmed. A pair of ReRAM or CBRAM resistive memory devices are configured as a one bit memory cell and used to store a single data bit wherein one of the resistive memory devices is in an ERASE condition and the other resistive memory devices of the pair is in a WRITE condition. Reading the resistance states of the resistive memory device pairs is accomplished without having to use a reference voltage or current since a trip-point is between the conductive states thereof.

25 Claims, 6 Drawing Sheets

(51) Int. Cl.
*G11C 13/00* (2006.01)
*G11C 7/06* (2006.01)
*G11C 14/00* (2006.01)
*G11C 17/16* (2006.01)
*G11C 17/18* (2006.01)

(56) References Cited

U.S. PATENT DOCUMENTS

| | | | | |
|---|---|---|---|---|
| 6,762,953 | B2* | 7/2004 | Tanizaki et al. | 365/158 |
| 7,394,295 | B2* | 7/2008 | Chang et al. | 327/58 |
| 7,495,971 | B2* | 2/2009 | Egerer | 365/189.09 |
| 8,587,994 | B2* | 11/2013 | Kim et al. | 365/158 |
| 8,750,018 | B2* | 6/2014 | Youn et al. | 365/148 |
| 9,070,424 | B2* | 6/2015 | Youn et al. | |
| 2002/0039309 | A1* | 4/2002 | Lu et al. | 365/158 |
| 2007/0170956 | A1 | 7/2007 | Su et al. | 327/55 |
| 2010/0091549 | A1 | 4/2010 | Lee et al. | 365/148 |
| 2011/0001108 | A1 | 1/2011 | Greene et al. | 257/2 |
| 2012/0044746 | A1* | 2/2012 | Chung | 365/148 |

OTHER PUBLICATIONS

International Search Report and Written Opinion, Application No. PCT/US2014/021656, 13 pages, May 28, 2014.

* cited by examiner

RESISTIVE RANDOM ACCESS MEMORY (RERAM) AND CONDUCTIVE BRIDGING RANDOM ACCESS MEMORY (CBRAM) CROSS COUPLED FUSE AND READ METHOD AND SYSTEM

RELATED PATENT APPLICATION

This application claims priority to commonly owned U.S. Provisional Patent Application Ser. No. 61/775,337; filed Mar. 8, 2013; which is hereby incorporated by reference herein for all purposes.

TECHNICAL FIELD

The present disclosure relates to resistive random access memory (ReRAM) and conductive bridging random access memory (CBRAM), and, in particular, to a ReRAM and CBRAM cross coupled fuse read method and system.

BACKGROUND

Resistive random access memory is based on the idea that a dielectric, which is normally insulating, can be forced to conduct. This can be accomplished, for example, through at least one filament or conduction path formed after application of a sufficiently high voltage across the dielectric material. Different mechanisms, such as defects, metal migration, etc., can lead to the formation of this conducting path(s). Once the conducting path(s) is formed, it may be reset, e.g., broken, resulting in a high resistance or set, e.g., re-formed, resulting a in lower resistance by an appropriately applied voltage. An appropriate electronic evaluation circuit may then be used to read the memory cell comprising the electrically modified conductance of this dielectric material. ReRAM and CBRAM like memory cells change their conductive state when an external electric field is applied thereto. If a unipolar read operation is used to read the state of the memory cell then the "memorized" resistance value of the memory cell will be disturbed.

SUMMARY

Therefore, a need exists for reliably reading a resistive memory cell even when a resistance value of the resistive memory element has changed from previous read operations, or if the cell resistance value changes due to poor memory cell data retention.

According to an embodiment, a resistive random access memory may comprise first and second resistive memory devices configured as a memory cell and a cross coupled read circuit coupled with the first and second resistive memory devices for reading conductive state values thereof, wherein a one bit value may be stored when the first and second resistive memory devices may be programmed for different conductive state values.

According to a further embodiment, the one bit value may be stored in the resistive random access memory when one of the first and second resistive memory devices may be programmed to have a first conductive state value and the other may be programmed to have a second conductive state value. According to a further embodiment, the first conductive state value may have a lower resistance than the second conductive state value. According to a further embodiment, the first conductive state value may have a high resistance than the second conductive state value. According to a further embodiment, the one bit value may be a logic one when the first resistive memory device may be at the first conductive state value and the second resistive memory device may be at the second conductive state value. According to a further embodiment, the one bit value may be a logic zero when the first resistive memory device may be at the second conductive state value and the second resistive memory device may be at the first conductive state value. According to a further embodiment, the one bit value may be a logic zero when the first resistive memory device may be at the first conductive state value and the second resistive memory device may be at the second conductive state value. According to a further embodiment, the one bit value may be a logic one when the first resistive memory device may be at the second conductive state value and the second resistive memory device may be at the first conductive state value. According to a further embodiment, the resistive random access memory may be a conductive bridging random access memory.

According to a further embodiment, a circuit may be configured to auto-adaptive adjust a trip value of the cross coupled read circuit. According to a further embodiment, an expose voltage applied to the first resistive memory device during a read operation may be controlled. According to a further embodiment, the read operation expose voltage may be controlled with a current source. According to a further embodiment, a value of the current source may be controlled to optimize memory read speed and resistive memory device disturbance intensity. According to a further embodiment, the one bit value may be read from the first and second resistive memory devices and stored in a one bit latch. According to a further embodiment, a plurality of first and second resistive memory devices may be provided in a microcontroller for storing configuration information. According to a further embodiment, the plurality of first and second resistive memory devices may be powered from an unregulated voltage supply. According to a further embodiment, the read conductive state values of the plurality of first and second resistive memory devices may be verified with at least one sense amplifier.

According to another embodiment, a resistive random access memory may comprise: first and second resistive memory devices; first and second transistors having sources thereof connected to respective ones of the first and second resistive memory devices, wherein the sources may be degenerated by the connected first and second resistive memory devices; and a diode connected transistor coupled to first and second transistors and adapted for sinking a reference current; wherein the diode connected transistor, and the first and second transistors form a degenerated current mirror.

According to a further embodiment, an exposed voltage on the first and second resistive memory devices may be controlled by the reference current. According to a further embodiment, drains of the first and second transistors may comprise first and second parasitic capacitances.

According to yet an embodiment, a method for reading a bit in a resistive random access memory may comprise the steps of: providing first and second resistive memory devices configured as a memory cell and a cross coupled read circuit coupled with the first and second resistive memory devices for reading conductive state values thereof; reading the conductive state values of the first and second resistive memory devices; and determining a one bit value from the read conductive state values of the first and second resistive memory devices.

According to a further embodiment of the method, may comprise the step of providing a plurality of memory cells for storing a plurality of one bit values. According to a further embodiment of the method, the cross coupled read circuit reads the conductive state values of each of the first and second resistive memory devices of the plurality of memory cells in determining the plurality of one bit values.

BRIEF DESCRIPTION OF THE DRAWINGS

A more complete understanding of the present disclosure may be acquired by referring to the following description taken in conjunction with the accompanying drawings wherein.

Figure 1:
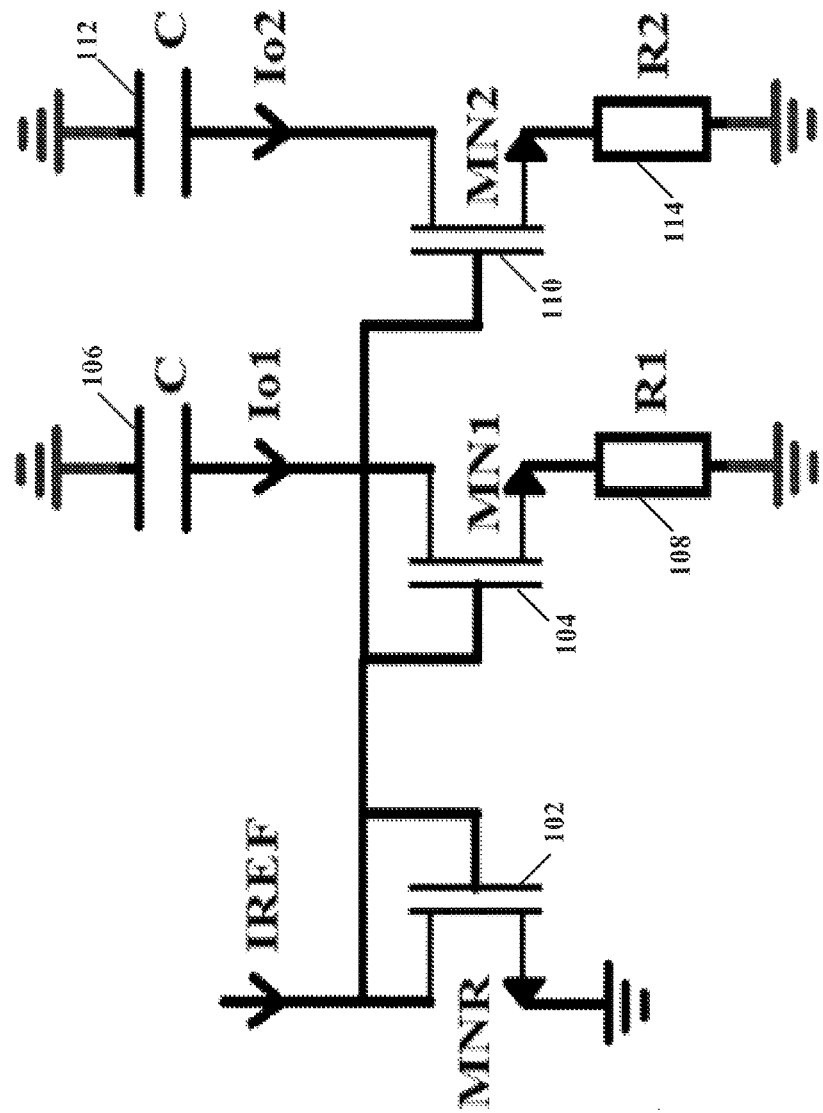
FIG. 1 illustrates a schematic diagram of a single bit resistive random access memory comprising two resistive memory devices coupled in a degenerated current mirror circuit, according a specific example embodiment of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

By arranging both a conductive and non-conductive resistive memory cell in a cross coupled arrangement to facilitate reading a data state the memory cells may have very small differences in their resistance values and still read correctly. This allows both of the memory cells' resistances to change over time and still have enough difference between their resistances to read the desired data state that was programmed.

According to various embodiments, an arrangement may provide for a READ operation that will expose the selected resistive memory devices to an electric field that does not substantially change their conductive states and, in addition, an adaptively built-in trip point may be provided that is consistently between the logic one (ON) and logic zero (OFF) states of the memory device. A one bit memory cell comprises two resistive memory devices.

A potential use of this READ arrangement and operation is for low frequency read operations and low disturb purposes, for example in certain microcontroller products that use configuration fuses according to various embodiments. The various embodiments may also be used in FUSE circuits (calibration and configuration fuses).

ReRAM (resistive random access memory) and CBRAM (conductive bridging random access memory) like memory cells change the conductive states of the resistive memory devices when an external electric field is applied across the resistive memory device. If a unipolar READ apparatus is adopted, then a READ operation will disturb the memorized conductive state values of the resistive memory devices. In order to not create a disturbance mechanism in the sense that the conductive state of the resistive memory device is changed to the opposite state and to have better coverage of the resistive conductance states in resolution, a cross coupled circuit may be implemented according to various embodiments of this disclosure using two resistive memory devices representing one bit. Thus the read operation will happen such that the most exposed resistive memory device is the one that changes its conductive state value in the direction where it is not opposite.

Another particularity of this READ apparatus is that the trip point is in-between the two conductive state values, so even though the conductance state values may change in the same direction for the two cross-coupled resistive memory devices, the conductance range that can be covered when a correct READ operation is higher than other implementations that compare the resistive memory device conductive states to a fixed reference.

The disturbance that is created during the unipolar READ may be controlled by a current source and a current value compromise may be optimized between read speed and disturbance intensity.

With this kind of READ apparatus, a FUSE implementation may be safer than others, in the sense that because of this circuit implementation data retention may be maximized, because even if the conductance states are changing in both resistive memory devices; the low conductance state ReRAM or CBRAM resistive memory device is less conductive and the non-conductive ReRAM or CBRAM resistive memory device is even less conductive, the READ operation will still be performed correctly because the trip point is in-between the two resistance values of the resistive memory devices. If the resistance of both resistive memory devices change in the opposite direction (e.g., window collapsing) this read apparatus will maximize the memory cell value storage lifetime because as long as there is even a small window it can still read correctly until transistor mismatch in the read circuit becomes greater than the window value between the ON and OFF (resistance) states of the resistive memory devices comprising the memory cell, according to the teachings of this disclosure.

According to various embodiments, a cross-coupled read structure for use with a ReRAM (electrically altered resistance RAM) or a CBRAM (Conductive Bridging RAM) resistive memory devices may be implemented. According to an embodiment, two (2) resistive memory devices are necessary to store a single bit of data. One ReRAM or CBRAM resistive memory device is programmed (low resistance state) and the other erased (high resistance state). These are wired to a cross-coupled read circuit. This is similar to the fuse read circuit used on some conventional EEPROM cell processes, but different because the ReRAM or CBRAM resistive memory device cannot be continually read. The same read principle works but the voltage across the ReRAM or CBRAM resistive memory device must be controlled to not disturb the resistive memory device and also not applied continuously, therefore the fuse bit will preferably only be read at power up or if a fuse bit error is detected by the logic. After the fuse is read it may be latched into digital latches.

This provides for a robust read circuit because an accurate (trimmed) reference is not needed for comparison with the resistive memory devices. Since the fuse holds the calibration data it must be read without calibration, therefore any reference circuit must work without calibration. According to various embodiments, two (2) resistive memory devices are compared that have been programmed in opposite conductive (resistance) states, thus directly making a robust read circuit.

Furthermore, according to various embodiments, data retention is maximized and the Read trip point is always between the states of the two (2) resistive memory devices. Since there is no fixed voltage reference required, a successful read operation may be accomplished with a very small difference between the resistances of the two (2) resistive memory devices. Also, the various embodiments disclosed herein provide for flexibility because they may be easily implemented into various microcontroller designs, wherein fuses are automatically read on power-up and the contents thereof stored in latches without the need for a state machine to read the memory block. According to various embodiments, all fuses may be read and latched at once, for example if each fuse has its own dedicated read circuit. A state machine to read fuses on power up as required in conventional devices is not needed.

According to some embodiments, fuses may be placed on the potentially unregulated supply Vdd input/output (I/O) so that calibration for a Vdd core regulator may be known before it is enabled.

However, without separate traditional sense amplifiers with a fixed reference it may not be possible to verify the individual resistive memory devices in the cross coupled structure. To add this may require costly and significant die area, but this can be minimized by sharing the sense amplifier between memory cell fuses, e.g., two cross coupled resistive memory devices, according to some embodiments for example, by providing only one sense amplifier for all of the memory cell fuses to be read.

Referring now to the drawings, the details of specific example embodiments are schematically illustrated. Like elements in the drawings will be represented by like numbers, and similar elements will be represented by like numbers with a different lower case letter suffix.

Referring to FIG. 1, depicted is a schematic diagram of a single bit resistive random access memory comprising two resistive memory devices coupled in a degenerated current mirror circuit, according a specific example embodiment of this disclosure. In the following, a cross coupled READ circuit will be described. In analyzing the trip resistance according to various embodiments, the basic principle of the fuse READ circuit relies on a degenerated current mirror circuit, shown in simplified form in FIG. 1. A diode connected NMOS transistor 102 sinks a reference current, Iref. For each memory read bit, there are two NMOS transistors 104 and 110 that have their sources degenerated by the connected resistive memory devices (ReRAM or CBRAM) 108 and 114, respectively. The NMOS transistors 102, 104 and 110 are configured as a degenerated current mirror. The expose voltage of the resistive memory devices 108 and 114 may be controlled by controlling the reference current, Iref. Also, the signal development by expose time may also be controlled. The drains of the NMOS transistors 104 and 110 may have parasitic capacitances 106 and 112, respectively.

Figure 2:
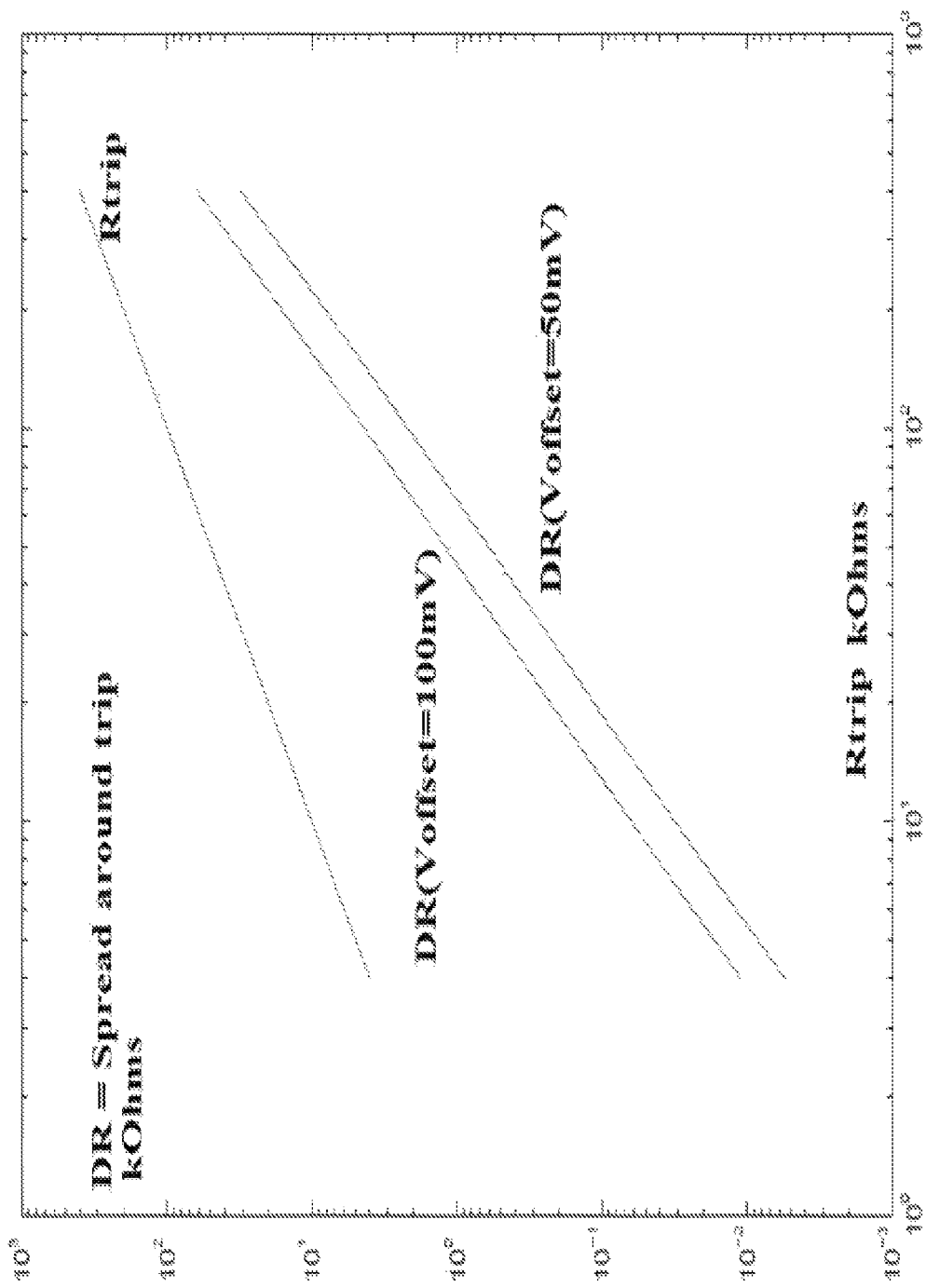
FIG. 2 illustrates a graph of trip point spreads for read circuit offset values (offset error) of 50 and 100 millivolts compared with a trip value, according to the teachings of this disclosure.

Referring to FIG. 2, depicted is a graph of trip point spreads for read circuit offset values (offset error) of 50 and 100 millivolts compared with a trip value, according to the teachings of this disclosure. The graph of FIG. 2 shows the spread around the trip point as a function of trip resistance for different mismatch equivalent offsets. In order to correctly sense the resistive state of the two resistive memory devices, enough signal has to be developed for the sense comparator so as to overcome the inherent equivalent offset and mismatch at the comparator input. So, taking a typical value of 50 millivolts (mv) or 100 millivolts, FIG. 2 shows how the forbidden zone increases with Rtrip. The forbidden zone is where the difference in resistance of the two resistive memory devices is not large enough for the sensing circuit to always give a correct result because of the 50 millivolts or 100 millivolts of offset error in the sense amp transistors due to transistor mismatch.

To evaluate the currents given by the two resistive memory devices by neglecting the body bias and degenerated like above, the following steps may be followed: First using the second Kirchhoff law between MNR (NMOS transistor 102), MN1 (NMOS transistor 104) and R1 (read cell 108) results in:

$$V_{GSR} = V_{GS1} + R_1 \cdot I_{OUT} \quad (1)$$

If the body bias is neglected, we get:

$$\sqrt{\frac{I_{REF}}{\beta}} = \sqrt{\frac{I_{OUT}}{\beta}} + R_1 \cdot I_{OUT} \quad (2)$$

From (2), we solve for $\sqrt{I_{OUT}}$ and get:

$$\sqrt{I_{OUT}} = \frac{\sqrt{1 + 4 \cdot R \cdot \sqrt{\beta \cdot I_{REF}}} - 1}{2 \cdot R \cdot \sqrt{\beta}} \quad (3)$$

Evaluating now the two currents, we get:

$$I_{O1} = \frac{\left(\sqrt{1 + 4 \cdot R_1 \cdot \sqrt{\beta \cdot I_{REF}}} - 1\right)^2}{4 \cdot R_1^2 \cdot \beta} \quad (4)$$

$$I_{O2} = \frac{\left(\sqrt{1 + 4 \cdot R_2 \cdot \sqrt{\beta \cdot I_{REF}}} - 1\right)^2}{4 \cdot R_2^2 \cdot \beta} \quad (5)$$

We are interested to find out the current difference around the trip point. For this suppose we have the following situation:

$$R_1 = R_{trip} + \Delta R \quad (6)$$

$$R_2 = R_{trip} - \Delta R \quad (7)$$

Now, we will evaluate $\sqrt{1 + 4 \cdot R_1 \cdot \sqrt{\beta \cdot I_{REF}}}$ around the trip point. The expression may be rewritten as follows:

$$\quad (8)$$

$$\sqrt{1 + 4 \cdot R_1 \cdot \sqrt{\beta \cdot I_{REF}}} = \sqrt{1 + 4 \cdot R_{trip} \cdot \sqrt{\beta \cdot I_{REF}} + 4 \cdot \Delta R \cdot \sqrt{\beta \cdot I_{REF}}}$$

Or $$\quad (9)$$

$$\sqrt{1 + 4 \cdot R_{trip} \cdot \sqrt{\beta \cdot I_{REF}} + 4 \cdot \Delta R \cdot \sqrt{\beta \cdot I_{REF}}} =$$

$$\sqrt{1 + 4 \cdot R_{trip} \cdot \sqrt{\beta \cdot I_{REF}}} \cdot \sqrt{\left(1 + \frac{4 \cdot \sqrt{\beta \cdot I_{REF}} \cdot \Delta R}{1 + 4 \cdot R_{trip} \cdot \sqrt{\beta \cdot I_{REF}}}\right)}$$

If $\Delta R \to 0$ then the above equation (9) may be expressed as follows:

$$\sqrt{1+4\cdot R_1 \cdot \sqrt{\beta \cdot I_{REF}}} \cong \sqrt{1+4\cdot R_{trip} \cdot \sqrt{\beta \cdot I_{REF}}} \cdot \left(1+\frac{2\cdot \sqrt{\beta \cdot I_{REF}} \cdot \Delta R}{1+4\cdot R_{trip}\cdot \sqrt{\beta \cdot I_{REF}}}\right) \quad (10)$$

In the same manner, we can write:

$$\sqrt{1+4\cdot R_2 \cdot \sqrt{\beta \cdot I_{REF}}} \cong \sqrt{1+4\cdot R_{trip} \cdot \sqrt{\beta \cdot I_{REF}}} \cdot \left(1-\frac{2\cdot \sqrt{\beta \cdot I_{REF}} \cdot \Delta R}{1+4\cdot R_{trip}\cdot \sqrt{\beta \cdot I_{REF}}}\right) \quad (11)$$

Using (4) and (5) and supposing again $\Delta R \to 0$ then we will have:

$$I_{o1} - I_{o2} \cong \frac{\frac{8\cdot \sqrt{\beta \cdot I_{REF}}}{\sqrt{1+4\cdot R_{trip}\cdot \sqrt{\beta \cdot I_{REF}}}} \cdot \Delta R \cdot \left(\sqrt{1+4\cdot R_{trip}\cdot \sqrt{\beta \cdot I_{REF}}}-1\right)}{4\cdot R_{trip}^2 \cdot \beta} \quad (12)$$

In the first phase of the fuse read, we develop this current difference across the two parasitic capacitances 106 and 112, and we want the difference between the evaluated voltages to be more than the offset voltage in a given signal development time, denoted by "$\tau$." If we write this, we get:

$$\frac{I_{o1}-I_{o2}}{C} \geq \frac{V_{offset}}{\tau} \quad (13)$$

And, if we use (12), we get:

$$\frac{\frac{8\cdot \sqrt{\beta \cdot I_{REF}}}{\sqrt{1+4\cdot R_{trip}\cdot \sqrt{\beta \cdot I_{REF}}}} \cdot \Delta R \cdot \left(\sqrt{1+4\cdot R_{trip}\cdot \sqrt{\beta \cdot I_{REF}}}-1\right)}{4\cdot R_{trip}^2 \cdot \beta \cdot C} \geq \frac{V_{offset}}{\tau} \quad (14)$$

From this last equation, we can get a trip point spread as a function of offset voltage as follows:

$$\boxed{\Delta R \geq \frac{V_{offset}}{\tau} \cdot \frac{4\cdot R_{trip}^2 \cdot \beta \cdot C}{8\cdot \sqrt{\beta \cdot I_{REF}} \cdot \left|\frac{1}{\sqrt{1+4\cdot R_{trip}\cdot \sqrt{\beta \cdot I_{REF}}}}-1\right|}} \quad (15)$$

Another important aspect is to determine the optimum trip range from which the fuse bits may be read correctly. Because the circuit also experiences a common mode voltage variation, the optimum range may be defined as the one that generates a common mode signal development substantially between $2\cdot V_{offset}$ and $V_{DD}-2\cdot V_{offset}$.

If we denote the common mode voltage by $V_{cm}$, and taking into account that this may be defined by:

$$V_{cm} = \frac{I_{o1}+I_{o2}}{2\cdot C} \cdot \tau \quad (16)$$

We may rewrite the above condition as follows:

$$2\cdot V_{offset} \leq \frac{I_{o1}+I_{o2}}{2\cdot C} \cdot \tau \leq V_{DD}-2\cdot V_{offset} \quad (17)$$

If we consider $\Delta R \to 0$ in (4) and (5), we get $$2\cdot V_{offset} \leq \frac{\left(\sqrt{1+4\cdot R_{trip}\cdot \sqrt{\beta \cdot I_{REF}}}-1\right)^2}{4\cdot R_{trip}^2 \cdot \beta \cdot C} \cdot \tau \leq V_{DD}-2\cdot V_{offset} \quad (18)$$

We will make the following notation in order to reduce the representation:

$$1+4\cdot R_{trip}\cdot \sqrt{\beta \cdot I_{REF}} \triangleq x \quad (19)$$

From (19), we can write:

$$R_{trip} = \frac{x-1}{4\cdot \sqrt{\beta \cdot I_{REF}}} \Rightarrow \boxed{4\cdot R_{trip}^2 \cdot \beta \cdot C = (x-1)^2 \cdot \frac{C}{4\cdot I_{REF}}} \quad (20)$$

Using (19) and (20), (18) becomes:

$$2\cdot V_{offset} \leq \frac{(\sqrt{x}-1)^2}{(x-1)^2} \cdot \frac{4\cdot I_{REF}}{C} \cdot \tau \leq V_{DD}-2\cdot V_{offset} \quad (21)$$

$$\frac{2\cdot V_{offset}\cdot C}{4\cdot I_{REF}} \leq \frac{(\sqrt{x}-1)^2}{(\sqrt{x}-1)^2 \cdot (\sqrt{x}+1)^2} \cdot \tau \leq \frac{(V_{DD}-2\cdot V_{offset})\cdot C}{4\cdot I_{REF}} \quad (22)$$

$$\frac{2\cdot V_{offset}\cdot C}{4\cdot I_{REF}\cdot \tau} \leq \frac{1}{(\sqrt{x}+1)^2} \leq \frac{(V_{DD}-2\cdot V_{offset})\cdot C}{4\cdot I_{REF}\cdot \tau} \quad (23)$$

$$\begin{cases}(\sqrt{x}+1)^2 \geq \frac{4\cdot I_{REF}\cdot \tau}{(V_{DD}-2\cdot V_{offset})\cdot C} \\ (\sqrt{x}+1)^2 \leq \frac{4\cdot I_{REF}\cdot \tau}{2\cdot V_{offset}\cdot C}\end{cases} \quad (24)$$

With this, we can write:

$$\sqrt{\frac{4\cdot I_{REF}\cdot \tau}{2\cdot V_{offset}\cdot C}}-1 \geq \sqrt{x} \geq \sqrt{\frac{4\cdot I_{REF}\cdot \tau}{(V_{DD}-2\cdot V_{offset})\cdot C}}-1 \quad (25)$$

$$\frac{4\cdot I_{REF}\cdot \tau}{2\cdot V_{offset}\cdot C}-2\cdot \sqrt{\frac{4\cdot I_{REF}\cdot \tau}{2\cdot V_{offset}\cdot C}} \geq 4\cdot R_{trip}\cdot \sqrt{\beta \cdot I_{REF}} \geq \frac{4\cdot I_{REF}\cdot \tau}{(V_{DD}-2\cdot V_{offset})\cdot C}-2\cdot \sqrt{\frac{4\cdot I_{REF}\cdot \tau}{(V_{DD}-2\cdot V_{offset})\cdot C}} \quad (26)$$

-continued $$\frac{\frac{4 \cdot I_{REF} \cdot \tau}{2 \cdot V_{offset} \cdot C} - 2 \cdot \sqrt{\frac{4 \cdot I_{REF} \cdot \tau}{2 \cdot V_{offset} \cdot C}}}{4 \cdot \sqrt{\beta \cdot I_{REF}}} \geq R_{trip} \geq \frac{\frac{4 \cdot I_{REF} \cdot \tau}{(V_{DD} - 2 \cdot V_{offset}) \cdot C} - 2 \cdot \sqrt{\frac{4 \cdot I_{REF} \cdot \tau}{(V_{DD} - 2 \cdot V_{offset}) \cdot C}}}{4 \cdot \sqrt{\beta \cdot I_{REF}}}$$ (27)

Figure 3:
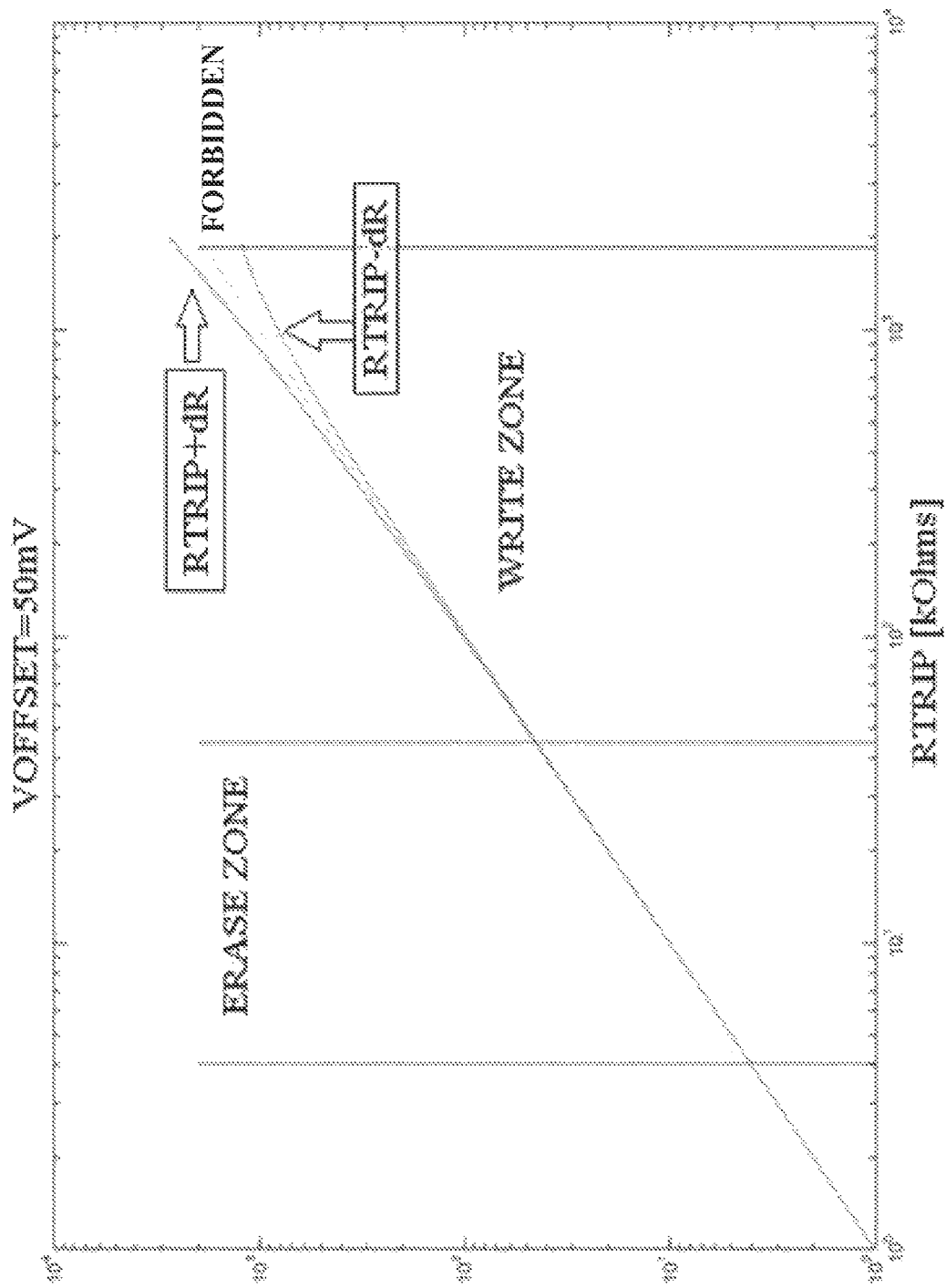
FIGS. 3 and 4 illustrate graphs of trip point spreads for offset values of 50 and 100 millivolts, respectively, according to the teachings of this disclosure.
Figure 4:
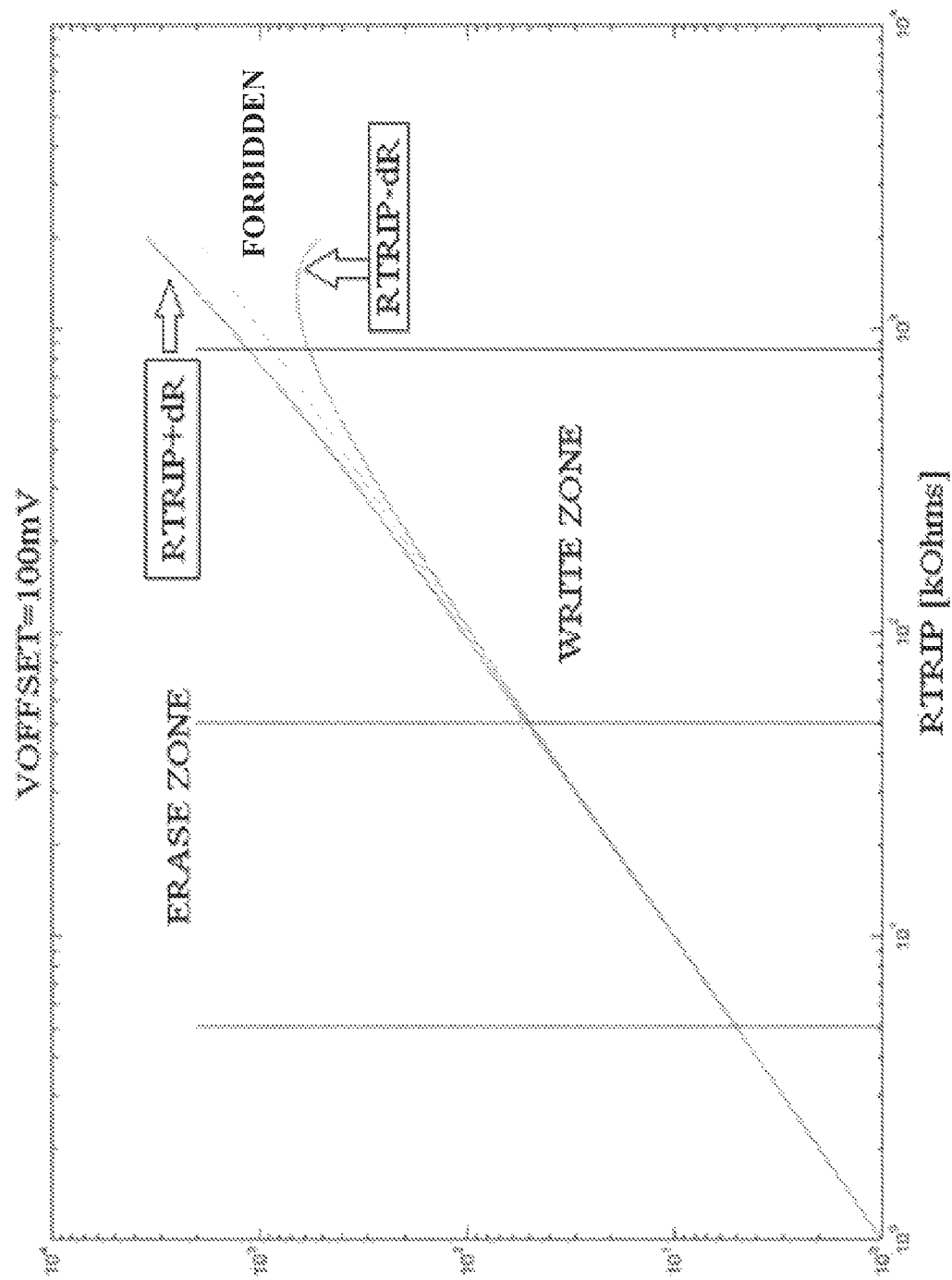

Referring to FIGS. 3 and 4, depicted are graphs of trip point spreads for offset values of 50 and 100 millivolts, respectively, according to the teachings of this disclosure. In the graphs shown in FIGS. 3 and 4, the $R_{trip}$ values are plotted, wherein the vertical lines indicate the limits given by (27) for $V_{DD}=1.8V$ and for $V_{DD}=3.6V$ for each offset value (e.g., 50 and 100 millivolts) considered. The maximum value is dependent only on offset value, while the lower value also depends on supply voltage.

In conclusion, the FUSE trip point is always in between the maximum programmed interpreted value and minimum erased interpreted value, so, if we bake the cells, the trip point rises and so the spread around this trip point increases as shown in FIGS. 3 and 4. The FUSE like circuit adapts the trip point to something in between the erased and programmed cell values, according to the teachings of this disclosure.

Figure 5:
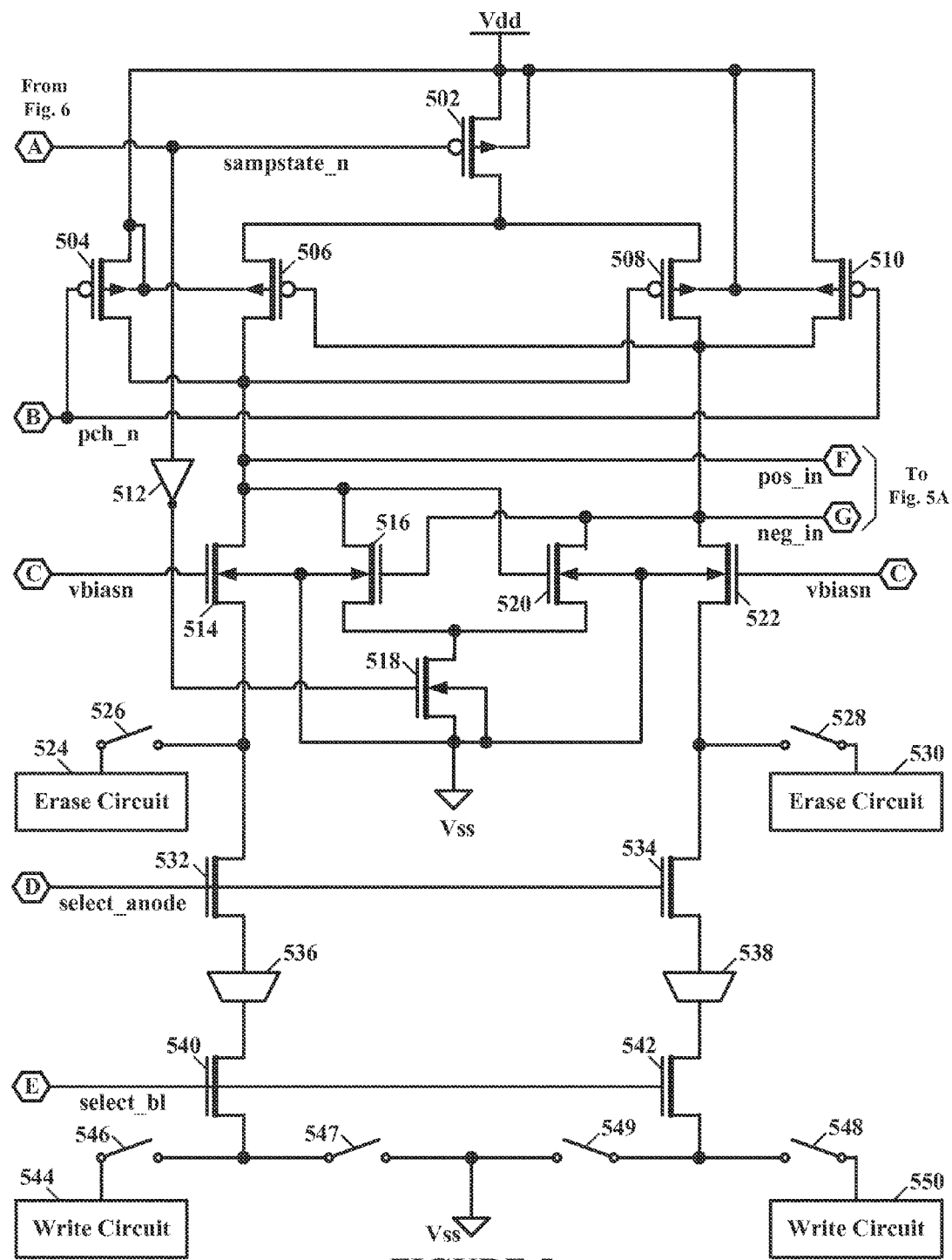
FIGS. 5 and 5A illustrate a schematic diagram of a read and erase/write circuit for the single bit resistive random access memory, according to a specific embodiment of this disclosure.
Figure 5A:
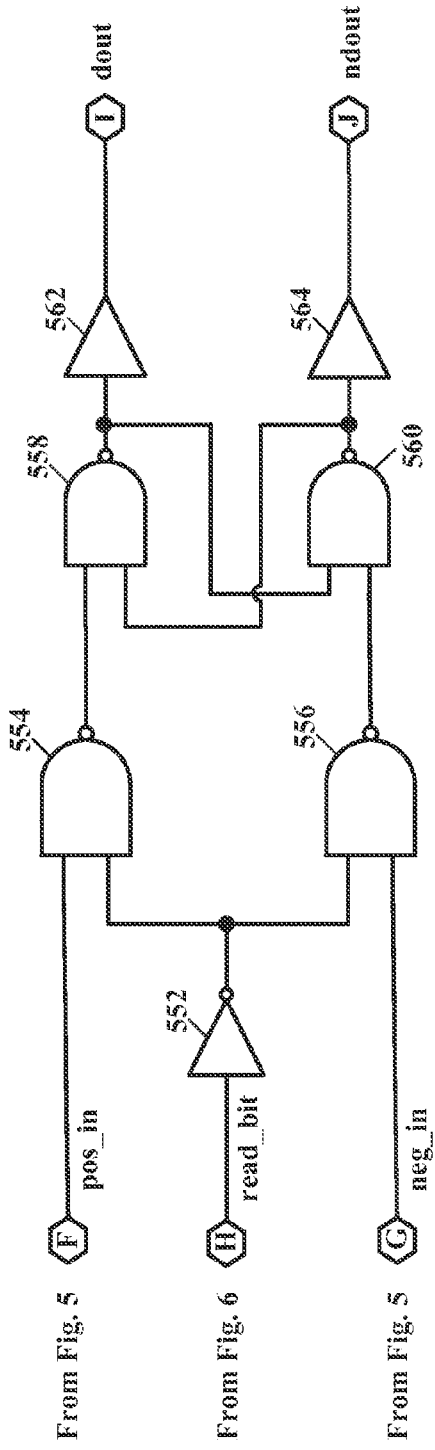

Referring to FIGS. 5 and 5A, depicted is a schematic diagram of a read and erase/write circuit for the single bit resistive random access memory, according to a specific embodiment of this disclosure. Once such circuit implementation for a read circuit and ERASE/WRITE circuits are shown in FIG. 5. FIG. 1 shows a schematic representation of the read circuit during sense and shows how the circuit may be biased. Between devices in FIG. 1 and FIG. 5 there are some correspondences, e.g., transistor 104 is in fact the transistor 514 in FIG. 5 and transistor 110 represents in fact the transistor 522 from FIG. 5. The parasitic capacitances 106 and 112 represent the parasitic capacitances of the nets pos_in and neg_in depicted in FIG. 5. The read cells 108 and 114 represent the equivalent resistance of the series connected transistor 532, resistive memory cell 536 and transistor 540; and transistor 534, resistive memory cell 538 and transistor 542, respectively. Transistors 506, 508, 516 and 520 form a latch circuit that may be enabled by transistor 502 and 518, which may act like switches, when the signal sampstate_n is at a logic LOW.

The WRITE circuit connects through switches 546 and 548, and select transistors 540 and 542 to the source terminals of memory cells 536 and 538 respectively, but the two Vss potentials will be disconnected by another two switches 547 and 549. In addition, during write the ERASE circuit will connect the drains of devices 532 and 534 to ground, while select anode voltage will be tied to VDD and vbiasn will be low, so devices 514 and 522 are turned off. These resistive memory devices typically may be erased or written by applying a positive voltage (+1 volt to +3 volts) across the cell to erase and a negative voltage (−3 volts to −1 volt) across the cell to write. Note that only one of the two memory elements will be written to, the other one will stay in the erased state. It is contemplated and within the scope of this disclosure that one having ordinary skill in integrated circuit logic and memory design and the benefit of this disclosure could easily design other circuit arrangements which would still be covered under the intent and spirit of this disclosure.

Figure 6:
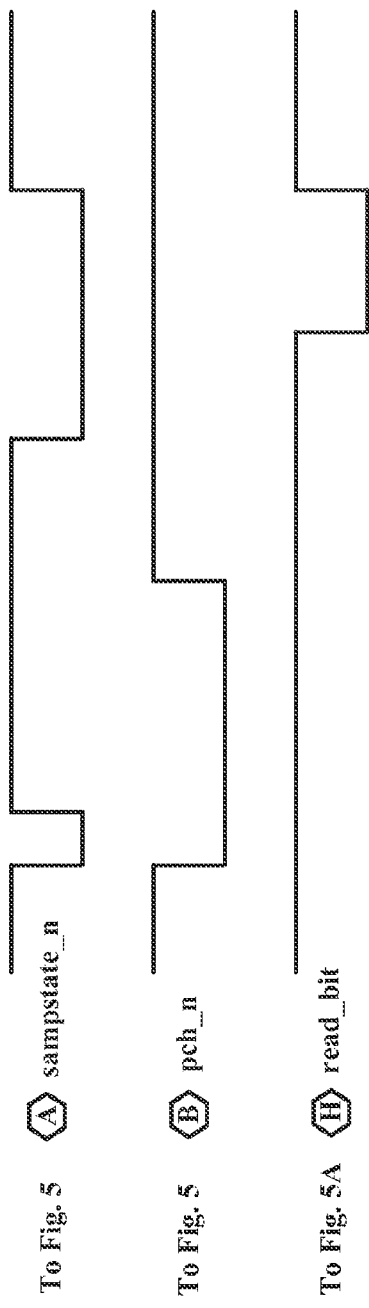
FIG. 6 illustrates a schematic timing diagram of the read and erase/write circuit shown in FIGS. 5 and 5A.

Referring to FIG. 6, depicted is a schematic timing diagram of the read and erase/write circuit shown in FIGS. 5 and 5A. FIG. 6 represents the diagram of the logic signals involved in the read operation. The read operation starts when sampstate_n goes low and discharges the sources of transistors 506, 508, 516 and 520 through transistors 502 and 518. When sampstate_n is stil low, pch_n will go low too and now the pre-charge cycle is about to begin when the sampstate_n goes high. In the pre-charge phase, neg_in and pos_in will be charged up to VDD through transistors 504 and 510, so that the parasitic capacitors 106 and 112 (see FIG. 1) may be discharged. When pch_n goes high the signal development phase starts up, and now the two charged capacitors are getting discharged through transistors 514 and 522, which are biased through vbiasn potential by transistor 102, but because there are different resistances in the sources of transistors 514 and 522, the discharge process happens with different speeds, so neg_in and pos_in decrease in time with different slopes. The signal development phase (tau) may be set by changing the time between the rising edge of pch_n and the second falling edge of sampstate_n, depending upon how resistive is the trip resistance. After the second rising edge of sampstate_n the transistors 506, 508, 516 and 520 create a latch and will drive to VDD the lower speed developed signal between neg_in and pos_in and to Vss the faster one. Now the sensed state may be stored in the output latch whose schematic diagram is shown in FIG. 5A. This may occur when read bit goes to a logic low.

Concluding, the FUSE trip point is always in between the maximum programmed interpreted value and minimum erased interpreted value, so, if the cells are baked, the trip point rises and so the spread around this trip point increases similar to what is shown in FIGS. 3 and 4. The FUSE like circuit adapts the trip point to something in between the erased and programmed resistance values of the resistive memory devices. In summary, a circuit has been described hereinabove that may be used in low frequency reads of the fuse values, for example configuration values of a microcontroller. It may also be used to continuously read the fuse values if disturbance occurs in the correct direction of the continuous exposed cell.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

What is claimed is:

1. A resistive random access memory comprising first and second resistive memory devices configured as a memory cell and a cross coupled read circuit coupled with the first and second resistive memory devices for reading conductive state values thereof, wherein a one bit value is stored when the first and second resistive memory devices are programmed for different conductive state values, wherein sources of first and second transistors are coupled with respective ones of the first and second resistive memory devices, wherein the sources are degenerated by the connected first and second resistive memory devices and wherein first and second parasitic capacitors are coupled between the drains of the first and second transistors and a reference potential; and a diode connected transistor coupled to first and second transistors and adapted for sinking a reference current;

wherein the resistive random access memory is configured to pre-charge the first and second parasitic capacitors and subsequently discharge the first and second parasitic capacitors through the first and second transistors wherein due to the different conductive states the capacitors are discharged with different slopes which is detected by the cross coupled read circuit.

2. The resistive random access memory according to claim 1, wherein the one bit value is stored in the resistive random access memory when one of the first and second resistive memory devices is programmed to have a first conductive state value and the other is programmed to have a second conductive state value.

3. The resistive random access memory according to claim 2, wherein the first conductive state value has a lower resistance than the second conductive state value.

4. The resistive random access memory according to claim 2, wherein the first conductive state value has a high resistance than the second conductive state value.

5. The resistive random access memory according to claim 2, wherein the one bit value is a logic one when the first resistive memory device is at the first conductive state value and the second resistive memory device is at the second conductive state value.

6. The resistive random access memory according to claim 5, wherein the one bit value is a logic zero when the first resistive memory device is at the second conductive state value and the second resistive memory device is at the first conductive state value.

7. The resistive random access memory according to claim 2, wherein the one bit value is a logic zero when the first resistive memory device is at the first conductive state value and the second resistive memory device is at the second conductive state value.

8. The resistive random access memory according to claim 7, wherein the one bit value is a logic one when the first resistive memory device is at the second conductive state value and the second resistive memory device is at the first conductive state value.

9. The resistive random access memory according to claim 1, wherein the resistive random access memory is a conductive bridging random access memory.

10. The resistive random access memory according to claim 1, wherein a signal development phase is set by changing the time between the end of precharging the parasitic capacitors and the activation of the latch.

11. The resistive random access memory according to claim 1, wherein an expose voltage applied to the first resistive memory device during a read operation is controlled.

12. The resistive random access memory according to claim 11, wherein the read operation expose voltage is controlled with a current source.

13. The resistive random access memory according to claim 12, wherein a value of the current source is controlled to optimize memory read speed and resistive memory device disturbance intensity.

14. The resistive random access memory according to claim 1, wherein the one bit value is read from the first and second resistive memory devices and stored in a one bit latch.

15. The resistive random access memory according to claim 1, wherein a plurality of first and second resistive memory devices are provided in a microcontroller for storing configuration information.

16. The resistive random access memory according to claim 15, wherein the plurality of first and second resistive memory devices are powered from an unregulated voltage supply.

17. The resistive random access memory according to claim 15, wherein the read conductive state values of the plurality of first and second resistive memory devices are verified with at least one sense amplifier.

18. The resistive random access memory according to claim 1, wherein an exposed voltage on the first and second resistive memory devices is controlled by the reference current.

19. A method for reading a bit in a resistive random access memory
comprising first and second resistive memory devices configured as a memory cell and a cross coupled read circuit coupled with the first and second resistive memory devices for reading conductive state values thereof, wherein sources of first and second transistors are coupled with respective ones of the first and second resistive memory devices, wherein the sources are degenerated by the connected first and second resistive memory devices and wherein first and second parasitic capacitors are coupled between the drains of the first and second transistors and a reference potential; and a diode connected transistor coupled to first and second transistors and adapted for sinking a reference current;
the method comprising the steps of:
pre-charging the parasitic capacitors while the cross coupled read circuit is inactive;
discharging the parasitic capacitors for a predetermined time; and
activating the cross-coupled read circuit thereby reading the conductive state values of the first and second resistive memory devices; and
determining a one bit value from the read conductive state values of the first and second resistive memory devices.

20. The method according to claim 19, wherein the time for discharging is set dependent on a trip resistance which depends on the conductive state values of the first and second resistive memory devices.

21. The method according to claim 20, wherein the pre-charging activates the latch for a first time period while said parasitic capacitors are coupled with a supply voltage for a second time period, wherein the first time period is shorter than the second time period and subsequently activating the latch for a third time period after said time for discharging.

22. The resistive random access memory according to claim 1, wherein the cross coupled read circuit comprises a latch which is controlled by the charge on said parasitic capacitors.

23. The resistive random access memory according to claim 22, wherein the latch is disconnected from the drains of the first and second transistors during pre-charging of the parasitic capacitors.

24. The resistive random access memory according to claim 1, comprising a pre-charge switching circuit configured to couple the sources of third and fourth transistors with the supply voltage.

25. The resistive random access memory according to claim 22, wherein the latch comprises
a third and fourth transistor whose sources are coupled with drains of the first and second transistors, respectively, wherein a gate of the third transistor is coupled with the source of the fourth transistor and the gate of the fourth transistor is coupled with the source of the third transistor;
a first switch configured to couple drains of the third and fourth transistor with a supply voltage,
a fifth and sixth transistor whose sources are coupled through a second switch with the reference potential and wherein a gate of the fifth transistor is coupled with the drains the second and sixth transistor and a gate of the sixth transistor is coupled with the drains of the first and fourth transistor.

* * * * *